United States Patent [19]

Andersson et al.

[11] 4,380,083
[45] Apr. 12, 1983

[54] METHOD OF AND AN ARRANGEMENT IN A TELECOMMUNICATION SYSTEM FOR REGULATING THE PHASE POSITION OF A CONTROLLED SIGNAL IN RELATION TO A REFERENCE SIGNAL

[75] Inventors: Karl A. I. Andersson, Ljusterö; Sture G. Roos, Bergshamra, both of Sweden

[73] Assignee: Telefonaktiebolaget L M Ericsson, Stockholm, Sweden

[21] Appl. No.: 196,556

[22] PCT Filed: Sep. 21, 1979

[86] PCT No.: PCT/SE79/00194
 § 371 Date: May 21, 1980
 § 102(e) Date: Apr. 17, 1980

[87] PCT Pub. No.: WO80/00901
 PCT Pub. Date: May 1, 1980

[30] Foreign Application Priority Data

Sep. 21, 1978 [SE] Sweden .............................. 7809934

[51] Int. Cl.³ ................................................ H03L 7/06
[52] U.S. Cl. .................................. 375/120; 331/1 A; 331/17; 328/63; 307/480
[58] Field of Search ........ 375/106, 111, 113, 118–120, 375/80, 81; 370/100; 307/269, 262, 480; 328/63, 155; 329/110, 118; 360/42, 44, 51; 340/167 B, 170; 331/17, 18, 25, 34, 1 A, 1 R

[56] References Cited

U.S. PATENT DOCUMENTS

| | | | |
|---|---|---|---|
| 3,057,962 | 10/1962 | Mann | 375/113 |
| 3,495,184 | 2/1970 | Perkins, Jr. | 331/17 |
| 3,521,172 | 7/1970 | Harmon | 328/55 |
| 3,614,635 | 10/1971 | La Pine | 331/17 |
| 3,660,647 | 5/1972 | Pryor | 328/55 |
| 3,798,558 | 3/1974 | Kopperschmidt | 307/262 |
| 3,839,599 | 10/1974 | Pitroda | 370/100 |

*Primary Examiner*—Benedict V. Safourek
*Assistant Examiner*—Stephen Chin
*Attorney, Agent, or Firm*—Hane, Roberts, Spiecens & Cohen

[57] ABSTRACT

The invention relates to a method for regulating the phase position of a controlled signal in relation to the phase position of a reference signal in a telecommunication system, and an arrangement for carrying out the method. A reference signal (C2) is delayed in a delay circuit (DL1) and the delayed reference signal (C2) is delayed in a delay circuit (DL1) and the delayed reference signal (D1) is compared with a controlled signal (C1) in a first comparison circuit (FF1) which produces a first comparison signal (Q1) at a high or a low level in dependence on the phase difference between the delayed reference signal (D1) and the controlled signal (C1). The controlled signal (C1) is delayed in a delay circuit (DL2) and the delayed controlled signal (D2) is compared in a second comparison circuit (FF2) with the reference signal (C2). The second comparison circuit (FF2) produces a second comparison signal (Q2) which is at a high or a low level in dependence on the phase difference between the signal (D2) and the reference signal (C2). The outputs from the comparison circuits (FF1,FF2) are connected to a logic circuit (LC). In dependence on the signal combination received at its inputs the logic circuit produces a binary control signal which is used to correct the phase position of the controlled signal (C1) in relation to the phase position of the reference signal (C2).

2 Claims, 5 Drawing Figures

4,380,083

METHOD OF AND AN ARRANGEMENT IN A TELECOMMUNICATION SYSTEM FOR REGULATING THE PHASE POSITION OF A CONTROLLED SIGNAL IN RELATION TO A REFERENCE SIGNAL

FIELD OF THE INVENTION

The invention relates to a method in a system such as telecommunication system for regulating the phase position of a controlled signal in relation to a reference signal and an arrangement for carrying out the method.

BACKGROUND OF THE INVENTION

In known technique, for example when phase detecting in phase locked loops, the phase difference between two signals is usually measured by starting counting pulses of known frequency at the positive edge of the reference signal and stopping counting at the positive edge of the controlled signal, the phase difference between the signals being determined by the number of pulses.

The disadvantage of this solution is that in order to obtain sufficient measuring precision the pulses must be of a sufficiently high frequency that such an arrangement is difficult to realize in TTL-technique. Consequently this will imply a more complicated component choice resulting in higher costs.

SUMMARY OF THE INVENTION

The method and the arrangement according to the invention which is characterized according to the claims solves said problem and allows a very accurate detection of the phase difference between two signals by means of a few simple components, the measuring result being utilized for controlling the phase position of the first signal in relation to the phase position of the second signal.

An arrangement according to the invention can, for example, be utilized when controlling the different clocks included in an arrangement for majority choice of a clock signal so that the phase positions of the clocks will be as close together as possible.

BRIEF DESCRIPTION OF THE DRAWING

The invention is described more in detail by means of an embodiment with reference to the accompanying drawing, where.

DESCRIPTION OF THE PREFERRED EMBODIMENT

Figure 1:
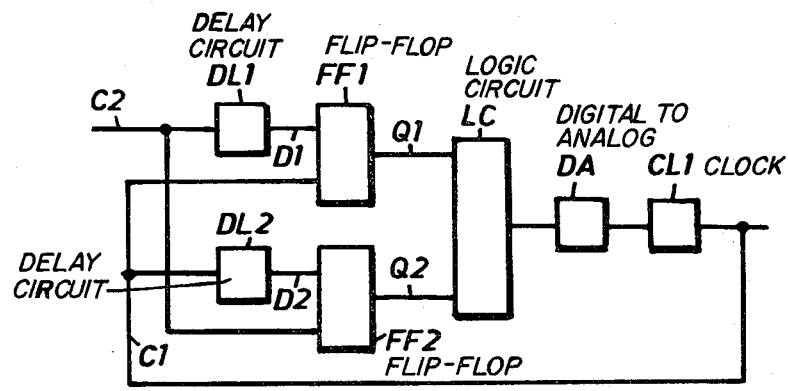
FIG. 1 represents a block diagram of an arrangement according to the invention.

As appears from FIG. 1 an arrangement according to the invention contains two D-flip-flops FF1, FF2 of that type which, in the dependence on the phase difference between two signals fed to two of its inputs, produces an output signal of a high or a low level respectively. The flip-flops can for example be of the type, offered by TEXAS INSTRUMENT under the designation 74S74.

To both these flip-flops are fed a reference signal C2 as well as a signal C1 to be controlled. The phase position of said signal C1 is to be regulated in relation to the phase position of the reference signal C2. The flip-flop FF1 receives on a first input a signal D1 which is the reference signal C2 delayed through a delay circuit DL1. On a second input the flip-flop FF1 receives the controlled signal C1 directly from a clock oscillator CL1.

The flip-flop FF2 receives on a first input a signal D2 which is the controlled signal C1 delayed through a delay circuit DL2 and receives on a second input the reference signal C2 directly. The delay circuits DL1 and DL2 are equal and consist of Schottky-buffers for example. In the circuits DL1 and DL2 several buffers can be connected in series and the size of the delay in the circuits is determined by the number of buffers, which number can be chosen by clamping. A delay circuit can also consist of a delay line, the size of the delay then being determined by the length of the delay line.

When the phase difference between the reference signal C2 and the controlled signal C1 according to the example exceeds ±5 nano seconds a correction of the phase position of the signal C1 will be carried out to bring the phase difference within these tolerance limits. The size of the tolerance limit can of course be changed by means of clamping thus connecting a different number of buffer stages in the delay circuits DL1, DL2. The output signals Q1 and Q2 from the flip-flops FF1 and FF2 respectively are set to their logical levels according to the phase differences between the signals C2 and C1 and are fed to the inputs of a logic circuit LC or a processor of known type for example a micro processor of the MOTOROLA M6900 manufacture.

The logic circuit LC produces a binary output signal which depends on the signal combination received on the inputs, which output signal after being converted in a digital/analogue converter DA, controls the frequency of the oscillator CL1. The oscillator produces a signal C1 the phase position of which is corrected in relation to the reference signal C2.

FIGS. 2-5 shows the various logical level the signals Q1 and Q2 obtain various phase differences between the signals C2 and C1. The dashes for lines in the figures mark the zero level line of the signals Q1 and Q2.

Figure 2:
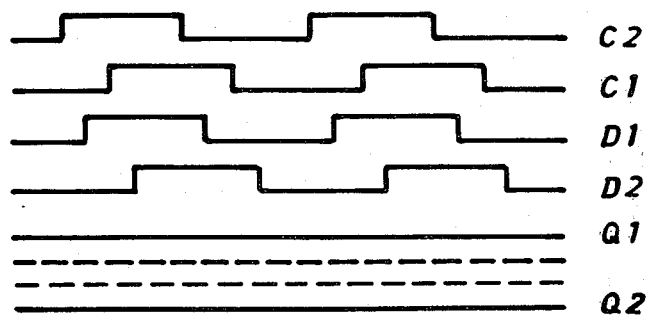
FIGS. 2-5 are time diagrams explaining the function of the arrangement at different phase differences between the signals.

In FIG. 2 the controlled signal C1 arrives at the input of the flip-flop FF1 than the delayed reference signal D1. The flip-flop FF1 produces an output signal Q1 of a high level as the first input of the flip-flop at the time of the comparison is occupied by a signal of high level. The flip-flop FF2, however, at this moment produces an output signal Q2 of a low level as the signal to the second input of the flip-flop in this case will preceed the signal to the first input of the flip-flop.

Figure 3:
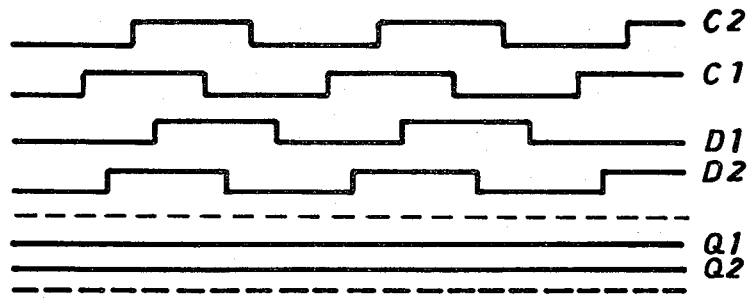

FIG. 3 shows how the reference signal C2 arriving later than the delayed signal D2. The flip-flop FF1 is forced to produce an output signal Q1 of a low level while the flip-flop FF2 produces an output signal Q2 of a high level.

Figure 4:
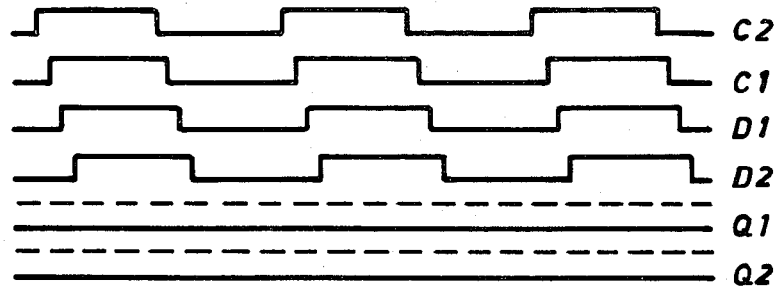

FIG. 4 shows the case when the phase difference between the signals C2 and C1 is less than the delay between the signals C2 and D1. In this case both the signal Q1 and the signal Q2 take a low level.

Figure 5:
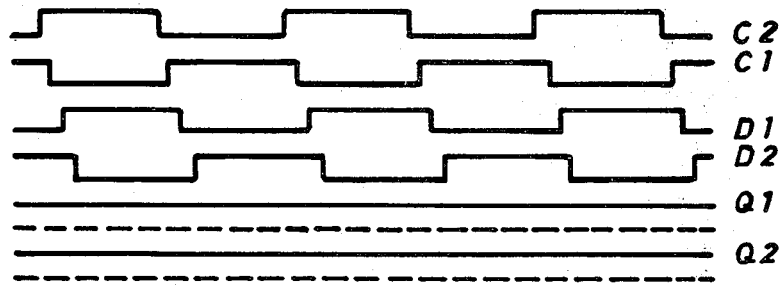

FIG. 5, finally, shows the case when the phase difference between the positive edge of the signal C2 and the negative edge of the signal C1 is less than the delay between the signal C2 and the signal D1. In this case both the signal Q1 and the signal Q2 take a high level.

Thus various control signals are obtained for the four possible combinations of signals. In the first case the control signal obtained from the circuit LC increases the frequency of the clock oscillator CL1, in the second case the control signal decreases the frequency of the clock oscillator and in the third and the fourth cases no change of the frequency of the oscillator is obtained.

As appears from the description it is possible to detect phase differences both near 0 degrees and 180 degrees very accurately by means of the arrangement according to the invention.

What we claim is:

1. Apparatus for regulating the phase position of a controlled signal with respect to a reference signal comprising a source of the reference signal, a first delay means for delaying the reference signal by a given period of time, a second delay means for delaying the controlled signal for said given period of time, a first comparison means having a first input connected to said first delay means to receive the reference signal delayed by said given period of time and a second input to receive the controlled signal for generating a first binary signal whose value is in indication of the relative phases of the received signals, a second comparison means having a first input connected to said second delay means to receive the controlled signal delayed by said period of time and a second input to receive the reference signal for generating a second binary signal whose value is an indication of the relative phases of the received signals, a controllable variable frequency oscillator means for generating the controlled signal, and control means connected to said comparison means for controlling the frequency of said variable frequency oscillator means in accordance with the values of the first and second binary signals.

2. Apparatus for regulating the phase position of a controlled signal with respect to a reference signal comprising a source of the reference signal, a first delay means for delaying the reference signal by a given period of time, a second delay means for delaying the controlled signal for said given period of time, a first comparison means having a first input connected to said first delay means to receive the reference signal delayed by said given period of time and a second input to receive the controlled signal for generating a first binary signal whose value is an indication of the relative phases of the received signals, a second comparison means having a first input connected to said second delay means to receive the controlled signal delayed by said period of time and a second input to receive the reference signal for generating a second binary signal whose value is an indication of the relative phases of the received signals, combining means for combining the first and second binary signals to form a two-bit binary number, a controllable variable frequency oscillator means for generating the controlled signal, and control means connected to said combining means for controlling the frequency of said variable frequency oscillator means in accordance with the values of the first and second binary signals.

* * * * *